United States Patent
Peeters et al.

(10) Patent No.: US 11,215,339 B2
(45) Date of Patent: Jan. 4, 2022

(54) WARM WHITE LED SPECTRUM ESPECIALLY FOR RETAIL APPLICATIONS

(71) Applicant: SIGNIFY HOLDING B.V., Eindhoven (NL)

(72) Inventors: Martinus Petrus Joseph Peeters, Eindhoven (NL); Rene Theodorus Wegh, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 16/610,356

(22) PCT Filed: Apr. 26, 2018

(86) PCT No.: PCT/EP2018/060707
§ 371 (c)(1),
(2) Date: Nov. 1, 2019

(87) PCT Pub. No.: WO2018/202534
PCT Pub. Date: Nov. 8, 2018

(65) Prior Publication Data
US 2020/0088383 A1    Mar. 19, 2020

(30) Foreign Application Priority Data

May 2, 2017  (EP) .................................... 17168963
May 4, 2017  (EP) .................................... 17169476

(51) Int. Cl.
*F21V 21/00* (2006.01)
*F21V 9/38* (2018.01)
(Continued)

(52) U.S. Cl.
CPC ............. *F21V 9/38* (2018.02); *C09K 11/0883* (2013.01); *C09K 11/7734* (2013.01);
(Continued)

(58) Field of Classification Search
CPC ......... F21V 9/38; F21K 9/64; C09K 11/0883; C09K 11/7734; C09K 11/89; F29Y 2115/10; F21W 2131/405
(Continued)

(56) References Cited

U.S. PATENT DOCUMENTS 10,439,110 B2 * 10/2019 Peeters ..................... F21V 9/40
2007/0052342 A1    3/2007 Masuda et al.
(Continued)

FOREIGN PATENT DOCUMENTS

EP    2432037 A1    3/2012
EP    2587559 A1    5/2013
(Continued)

OTHER PUBLICATIONS

X. Tang et al, "The appreciation of LED-based white light sources by Dutch and Chinese people in three application areas", Lighting Res. Technol, 2018: 0: 1-20.
(Continued)

*Primary Examiner* — Laura K Tso
(74) *Attorney, Agent, or Firm* — Daniel J. Piotrowski (57) ABSTRACT

The invention provides a lighting device (100) configured to provide lighting device light (101), the lighting device (100) comprising a solid state light source (10) configured to provide blue light (11) having a peak wavelength ($\lambda_{PWL}$) selected from the range of 430-455 nm, a first luminescent material (210) configured to convert part of the blue light (11) into first luminescent material light (211) and a second luminescent material (220) configured to convert part of one or more of the blue light (11) and the first luminescent material light (211) into second luminescent material light (221), wherein the solid state light source (10), the first luminescent material (210), and the second luminescent material (220) are selected to provide at a first setting of the lighting device (100) white lighting device light (101) having a CRI of at least 90, a $R_9$ value of at least 70, and a $R_{50}$ value of at maximum 465 nm, wherein the $R_{50}$ value is defined as a first wavelength ($\lambda_{50}$) in a spectral distribution of the white lighting device light (101) at the first setting, wherein the first wavelength ($\lambda_{50}$) is a wavelength closest to
(Continued)

the peak wavelength ($\lambda_{PWL}$) but at a longer wavelength than the peak wavelength ($\lambda_{PWL}$) of the blue light (11) where the peak intensity ($I_{50}$) is 50% of the intensity ($I_{PWL}$) at the peak wavelength ($\lambda_{PWL}$).

14 Claims, 5 Drawing Sheets

(51) Int. Cl.
- *F21K 9/64* (2016.01)
- *C09K 11/08* (2006.01)
- *C09K 11/77* (2006.01)
- *C09K 11/89* (2006.01)
- *F21Y 115/10* (2016.01)
- *F21W 131/405* (2006.01)

(52) U.S. Cl.
CPC ............... *C09K 11/89* (2013.01); *F21K 9/64* (2016.08); *F21W 2131/405* (2013.01); *F21Y 2115/10* (2016.08)

(58) Field of Classification Search
USPC .......................................................... 362/84
See application file for complete search history.

(56) References Cited

U.S. PATENT DOCUMENTS

| | | | |
|---|---|---|---|
| 2010/0328926 A1* | 12/2010 | Hoelen | F21K 9/64 362/84 |
| 2016/0218254 A1 | 7/2016 | Jacobson et al. | |
| 2019/0055468 A1* | 2/2019 | Oepts | C09K 11/08 |

FOREIGN PATENT DOCUMENTS

| | | |
|---|---|---|
| WO | 2007122531 A2 | 11/2007 |
| WO | 2013150470 A1 | 10/2013 |
| WO | 2015015363 A1 | 2/2015 |
| WO | 2015124755 A1 | 8/2015 |
| WO | 2017021087 A1 | 2/2017 |
| WO | 2017044380 A1 | 3/2017 |

OTHER PUBLICATIONS

Ohno, Y, et al, "Vision Experiment on Chroma Saturation for Color Quality Preference", Proceedings of 28th CIE Session, 2015, pp. 60-69.

Malaysian Standard, Lighting of Indoor Work Places, MS ISO 8995:2005, (ISO 8995:2002, IDT), CIE, 2001, Department of Standards Malaysia, pp. 1-24.

* cited by examiner

FIG. 8 ical Application No. PCT/EP2018/060707, filed on Apr. 26, 2018, which claims the benefit of European Patent Application Nos 17168963.1, filed on May 2, 2017 and 17169476.3, filed on May 4, 2017. These applications are hereby incorporated by reference herein.

WARM WHITE LED SPECTRUM ESPECIALLY FOR RETAIL APPLICATIONS

CROSS-REFERENCE TO PRIOR APPLICATIONS

This application is the U.S. National Phase application under 35 U.S.C. § 371 of International Application No. PCT/EP2018/060707, filed on Apr. 26, 2018, which claims the benefit of European Patent Application Nos 17168963.1, filed on May 2, 2017 and 17169476.3, filed on May 4, 2017. These applications are hereby incorporated by reference herein.

FIELD OF THE INVENTION

The invention relates to a lighting device, a lighting system comprising such lighting device, as well as the use of such lighting device.

BACKGROUND OF THE INVENTION

White lighting devices are known in the art. WO2013/150470, for instance, describes a light emitting module adapted to produce white output light having an emission peak in the wavelength range from 400 to 440 nm, which comprises at least one first light emitting element adapted to emit light having an emission peak in a first wavelength range from 440 to 460 nm, at least one wavelength converting material arranged to receive light emitted by said first light emitting element, and being capable of emitting light having an emission peak in the green to red wavelength range, and at least one second light emitting element adapted to emit light having an emission peak in a second wavelength range from 400 to 440 nm. Such module provides white light with a "crisp white" effect.

WO 2015/124755 A1 discloses a light emitting module comprising a first module that emits first light with a first color point of white light, and a second module that emits a peak of blue light having a peak wavelength in the range of 440-470 nm.

WO 2017/021087 A1 discloses a lighting device comprising a light source that generates deep blue radiation in the range of 400-440 nm and blue light in the range of 440-490 nm, and a first and second luminescent material for conversion of at least a part of the light from the light source.

WO 2015/015363 A1 discloses a light-emitting arrangement comprising a blue light-emitting element having an emission peak in the range of 440-460 nm, a deep blue light-emitting element having an emission peak in the range of 400-440 nm, a narrow band wavelength converting material and a broad band wavelength converting material.

US2016/116124 A1 discloses a lighting system comprising a light emitting diode being configured to receive an electrical power that varies, a first phosphor, a second phosphor having a conversion efficiency that varies as the power varies, wherein the light from the LED, the first phosphor and the second phosphor combined to form emitted light.

EP2587559 A1 discloses a white light emitting semiconductor device with an LED and a phosphor material that converts the light from the LED. The phosphor material includes a green phosphor and a wide-band red phosphor.

EP2432037 A1 discloses a white light emitting semiconductor device with an LED, a first phosphor that generates blue light, a second phosphor that generates green light and third phosphor that generates red light.

SUMMARY OF THE INVENTION

For retail lighting, often CDM (ceramic discharge metal halide) lighting is applied. The CDM technology has been massively adopted for illumination of merchandise in shops.

Key for adoption of alternative lighting devices seem a high efficiency (especially >100 lm/W) and a high color rendering (especially CRI≥90) and optimal white perception (which is achieved in WO2013/150470 by excitation of optical brightness agents via the deep blue wavelengths in the lamp emission spectrum).

With the introduction of LEDs, replacement of the above CDM technology is possible. The main LED light source applied in Retail lighting is Chip on Board (CoB). The small diameter (light emitting source) of the CoB enables spot lighting with narrow beam angles. However, general acceptance of these LED solutions has been hampered by lagging of efficiency, color and white perception.

A breakthrough in LED lighting for Retail has been the invention of Crisp White in WO2013/150470 (see also above). The addition of a deep blue emission peak excites the optical brightening agents, present in white fabrics, paint and plastics. That results in a strongly improved whiteness perception. This Crisp White source is accepted in the market as the replacement of CDM in terms of whiteness and color rendering.

It appears that an alternative to adding deep blue light to the emission spectrum is to change the color point of the emitted source to a color point much below BBL. The mainstream Retail Lighting CCT is 3000K, and a concomitant color point is significantly below the Black Body Line (black body locus (BBL)), such as CIE y at least 0.05 below the BBL (CIE 1931). Good results can be obtained with color temperatures in the range of about 2500-3500 K and with CIE y (thus) at least 0.05 below the BBL (CIE 1931).

This allows providing a light source having a target color point below BBL with the emission spectrum not having the additional deep blue, as indicated above. Hence, the whiteness appreciation is not due to additional deep blue but due to the color point being lower with respect to the BBL.

A high CRI does not always provide the desired color perception. The use of the gamut area index seems useful to further characterize desired optical properties. The gamut of the colors rendered by the light source can be measured by a metric known as Gamut Area Index (GAI or $G_a$). If the color points used to calculate CRI are connected in a two-dimensional space, the bounded area they form is the gamut area. A higher GAI results in saturation of colors.

Rendering the colors used in CRI with a black body radiator, at a CCT of 3000K, will produce a CRI of 100. For any light source that does not render the color points exactly as rendered by the black body radiator, CRI will be less than 100. Connecting the rendered color points will form a gamut area.

Gamut Area Index is calculated by dividing the gamut area formed by the light source with the gamut area formed by the reference source using the same set of colors that are used for CRI.

Despite its limitations, the general color rendering index ($R_a$) is still the only CIE standardized and widely used index to rate the color rendering properties of a light source. It is used by lighting manufacturers in product specification sheets, by national and international standards [1-7] and regulatory bodies [8-11] to set minimum requirements, and in rebate programs [12]. The general color rendering index is a measure how accurate a lamp can reproduce the color rendition for a defined set of test-color samples in comparison to a reference illuminant with the same correlated color temperature. Because only color differences are calculated and averaged, $R_a$ will inevitably decrease with increasing color differences, irrespective if the colors are reproduced more or less colorful in comparison to the reference illuminant. It would be beneficial to add, next to $R_a$, a second index that captures the average change in colorfulness.

Jost et al. (http://lrt.sagepub.com/cgi/reprint/1477153514555882v1.pdf?ijkey=bIow1xbucFTGo5V&keytype=finite) (Lighting Res. Technol. 2014; 0:1-26) have found that naturalness correlates best with fidelity based indices, like $R_a$, and object attractiveness correlates best with gamut area based indices. To enable making a direct trade-off between naturalness and attractiveness for a lamp to be tested, it is necessary to calculate the gamut area based index with same methodology and test-color samples as used for calculating the general color rendering index. To this end, the gamut area index shall be based on the method and procedure described in CIE publication 13.3-1995 [13], which is herein incorporated by reference. This section includes the method for calculating the relative gamut area index. In order to indicate that the relative gamut area index should best be used in conjunction with the general color rendering index ($R_a$), the Relative Gamut Area Index is designated by the symbol $G_a$.

The procedure for calculating the relative gamut area index ($G_a$) is based on the rating procedure described in section 5 of CIE publication 13.3-1995 [13]. The gamut area for both the lamp to be tested and the reference illuminant must be calculated with the set of eight test-color samples, for which the spectral radiance factors are specified in section 8, table 1, of CIE13.3-1995 [13]. For doing so, first the CIE 1931 tristimulus values of the eight test-colors must be determined for both the lamp to be tested and the reference illuminant. The next step is to transform these tristimulus values into coordinates of the 1960 UCS diagram.

The adaptive color shift is accounted for by a Von Kries transformation with the fundamental primaries given by D. B. Judd (Proceedings of the National Academy of Sciences, 07/1966; 55(6): 1313-30. DOI: 10.1073/pnas.55.6.1313).

The relative gamut area index is calculated in the 1960 uniform color space.

With respect to the reference illuminant, the same procedure is employed as described in section 5.2 of CIE13.3-1995 [13].

With respect to the tolerances for reference illuminant, the same criteria shall be used as described in section 5.3 of CIE13.3-1995 [13].

With respect to the test-color samples, only the set of eight test-color samples described in section 5.4 (and section 8, table 1) of CIE13.3-1995 [13], shall be used.

With respect to the determination of CIE 1931 tristimulus values of the eight test-color samples, the same procedure as specified in section 5.5 of CIE13.3-1995 [13] shall be used.

With respect to the transformation into 1960 UCS coordinates, the same procedure as specified in section 5.6 of CIE13.3-1995 [13] shall be used, but only for the eight test-color samples specified in table 1 of section 8. This will provide the chromaticity coordinates for the eight test color samples (i=1, 8) in the 1960 uniform color space for lamp to be tested ($u_{k,i}$, $v_{k,i}$) as well as for the reference illuminant ($u_{r,i}$, $v_{r,i}$).

With respect to the consideration of adaptive (perceived) color shift, the same procedure as specified in section 5.7 of CIE13.3-1995 [13] shall be used, but only for the eight test-color samples specified in table 1 of section 8. This will provide the chromaticity coordinates ($u'_{k,i}$, $v'_{k,i}$) for the eight test color samples (i=1, 8) in the 1960 uniform color space for lamp to be tested (k) after considering the adaptive color shift.

With respect to the determination of the gamut areas, the gamut area for the reference illuminant ($GA_{ref}$) shall be calculated with the chromaticity coordinates for the test-color samples, illuminated with the reference illuminant (r), (see above) by using the following formulae:

$$GA_{ref} = ((u_{r,1} \times v_{r,2}) - (u_{r,2} \times v_{r,1}) + (u_{r,2} \times v_{r,3}) - (u_{r,3} \times v_{r,2}) + (u_{r,3} \times v_{r,4}) - (u_{r,4} \times v_{r,3}) + (u_{r,4} \times v_{r,5}) - (u_{r,5} \times v_{r,4}) + (u_{r,5} \times v_{r,6}) - (u_{r,6} \times v_{r,5}) (u_{r,6} \times v_{r,7}) - (u_{r,7} \times v_{r,6}) + (u_{r,7} \times v_{r,8}) - (u_{r,8} \times v_{r,7}) + (u_{r,8} \times v_{r,1}) - (u_{r,1} \times v_{r,8}))/2$$

The gamut area for the lamp to be tested ($GA_{test}$) shall be calculated with the chromaticity coordinates for the test-color samples, illuminated with the lamp to be tested (k), after considering the adaptive color shift (see above) by using the following formulae:

$$GA_{test} = ((u'_{k,1} \times v'_{k,2}) - (u'_{k,2} \times v'_{k,1}) + (u'_{k,2} \times v'_{k,3}) - (u'_{k,3} \times v'_{k,2}) + (u'_{k,3} \times v'_{k,4}) - (u'_{k,4} \times v'_{k,3}) + (u'_{k,4} \times v'_{k,5}) - (u'_{k,5} \times v'_{k,4}) + (u'_{k,5} \times v'_{k,6}) - (u'_{k,6} \times v'_{k,5}) + (u'_{k,6} \times v'_{k,7}) - (u'_{k,7} \times v'_{k,6}) + (u'_{k,7} \times v'_{k,8}) - (u'_{k,8} \times v'_{k,7}) + (u'_{k,8} \times v'_{k,1}) - (u'_{k,1} \times v'_{k,8}))/2$$

The relative gamut area index ($G_a$) shall be calculated with the gamut area values for the reference illuminant ($GA_{ref}$) and for the lamp to be tested ($GA_{test}$) (see above) according to the following formulae:

$$G_a = 100 \times GA_{test}/GA_{ref}$$

The relative gamut area index ($G_a$) can be used in conjunction with the general color rendering index ($R_a$) to disclose additional information on the color rendering quality of a light source, based on the same set of test-color samples. It reveals other information than disclosed by $R_a$. According to the work done by Jost et al., $R_a$ correlates well with naturalness, whereas gamut-based indices show a high correlation with attractiveness. Additional analysis on the data provided by Jost shows that $G_a$ also correlates well with attractiveness. In a two-dimensional ($R_a$-$G_a$) system one axis could be related to naturalness and the other axis to object attractiveness. Such a trade-off cannot easily be made when all information is condensed into one single average index value. Care shall be taken to generalize the findings of this experiment into areas of high naturalness and of high attractiveness, because the balance between naturalness and object attractiveness depends on the intended application [14]. Although the correlation between object attractiveness and Ga is on average high, there is a limit to the amount of increase in gamut area [15], in particular for skin tone rendering one should be careful [14]. Furthermore, a high fidelity ($R_a$) score does not necessarily mean a natural rendition of objects.

As indicated above, the procedure for calculating the relative gamut area index ($G_a$) is described. It should best be used in conjunction with $R_a$ to indicate the origin for a lower fidelity score, i.e., larger or smaller color gamut compared to the reference source. However, also $G_a$ summarizes all color shifts into one single number, whereas a relatively small shift for a specific color may be more important for a specific application than relatively larger shifts for other colors. A graphical representation provides a comprehensive overview on the changes in colorfulness and hue shifts for all individual colors used to determine index values $R_a$ and $G_a$. It is supplementary and helps in making more informed design decisions.

The procedure for calculating the general color rendering graphic is based on the methodology described in the previous section (see above). Starting points are the chromaticity coordinates for the reference illuminant ($u_{r,i}$, $v_{r,i}$) determined with the procedure described above and the chromaticity coordinates for the lamp to be tested after considering the adaptive color shift ($u'_{k,i}$, $v'_{k,i}$) determined with the procedure described above. The chromaticity coordinates shall first be transformed from the CIE 1960 UCS to more perceptually uniform CIE 1976 UCS by means of the following formulae:

$$u'=u, v'=1.5 \times v$$

Subsequently, the distance from the white-point to each of the chromaticity coordinates of the eight test-color samples shall be calculated. The chromaticity coordinates of the lamp to be tested shall be close to the black body locus as specified above (section 5.3 of CIE13.3-1995). Therefore, the chromaticity coordinates of the white point of the lamp to be tested, after consideration of adaptive color shift, are equal to the chromaticity coordinates of the reference illuminant ($u'_{wr}$, $v'_{wr}$). For all eight test-color samples (i), the distance to reference white point shall be determined by using the following formulae:

$$\Delta u'_{r,i} = u'_{r,i} - u'_{wr} \text{ and } \Delta v'_{r,i} = v'_{r,i} - v'_{wr} \text{ for the reference source } (r)$$

$$\Delta u'_{k,i} = u'_{k,i} - u'_{wr} \text{ and } \Delta v'_{k,i} = v'_{k,i} \times 1.5 - v'_{wr} \text{ for the lamp to be tested } (k)$$

For the lamp to be tested, symbol $v'_{k,i}$ is already specified above. Therefore, this value shall be multiplied with 1.5 to transform it from the CIE 1960 UCS to CIE 1976 UCS.

To enable comparison of the relative color shifts for the lamp to be tested, compared to the reference illuminant, the distances from the reference white point ($u'_{wr}$, $v'_{wr}$) shall first be normalized to unity for all individual test-color samples (i) illuminated with the reference illuminant (r). Subsequently, the distances from ($u'_{wr}$, $v'_{wr}$) to the chromaticity coordinates for the test-color samples (i), illuminated with the test lamp (k), shall be scaled accordingly according to the following formulae:

$$\Delta u'_{N,r,i} = \Delta u'_{r,i}/(\Delta u'^2_{r,i} + \Delta v'^2_{r,i})^{0.5}, \Delta v'_{N,r,i} = \Delta v'_{r,i}/(\Delta u'^2_{r,i} + \Delta v'^2_{r,i})^{0.5}$$

$$\Delta u'_{N,k,i} = \Delta u'_{k,i}/(\Delta u'^2_{r,i} + \Delta v'^2_{r,i})^{0.5}, \Delta v'_{N,k,i} = \Delta v'_{k,i}/(\Delta u'^2_{r,i} + \Delta v'^2_{r,i})^{0.5}$$

Figure 8:
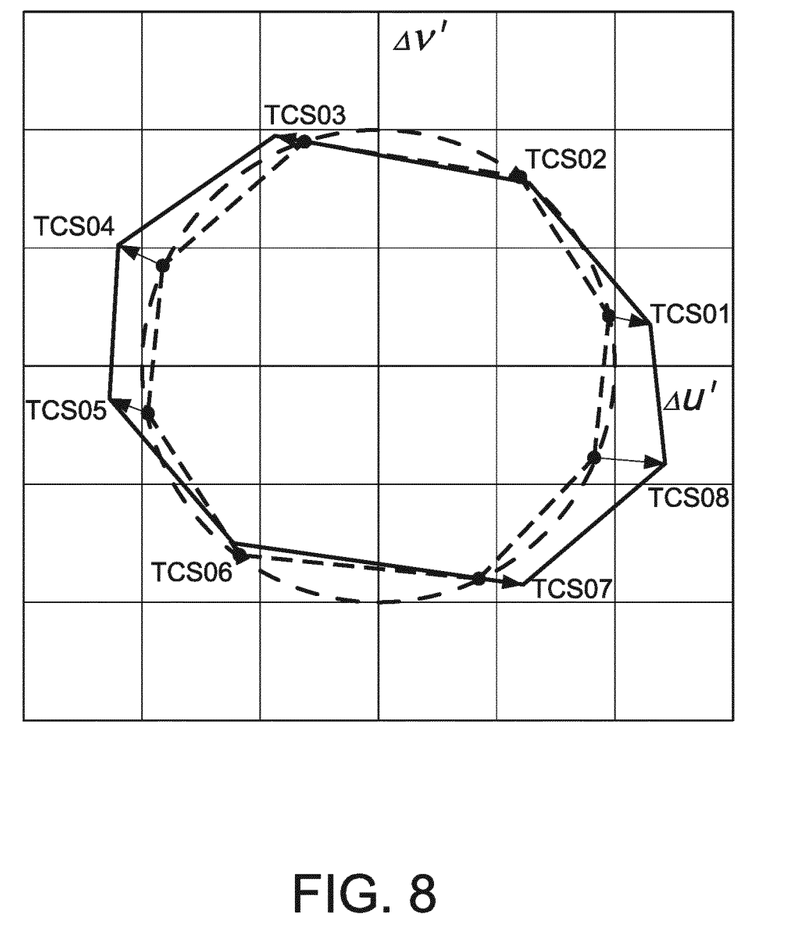
FIG. 8: example of a general colour rendering index graphic for a test light source, which was used in the study by Jost et al. The graphic shows the changes in colorfulness and hue shifts for the eight CIE1974 test-color samples (defined in CIE publication 13.3-1995). The dashed circle indicates a distance of unity to the origin, whereas the solid line, connecting the points for the test light source, indicates the relative increase in gamut area. The arrows in the graphic represent the change in colorfulness and hue for the eight test-color samples, relative to the reference illuminant.

The scaled color difference coordinates for the reference source ($\Delta u'_{N,r,i}$, $\Delta v'_{N,r,i}$) and the lamp to be tested ($\Delta u'_{N,k,i}$, $\Delta v'_{N,k,i}$) can be represented as a, general color rendering index, graphic in the CIE 1976 $\Delta u'$, $\Delta v'$ color space, with the chromaticity coordinates of the white point ($u'_{wr}$, $v'_{wr}$) as the origin. An example is provided in FIG. 8.

The advantage of the color rendering index graphic is that it shows why the general color rendering index ($R_a$) deviates from a value of 100. It shows the relative color variations for all eight test-color samples, both the magnitude and the hue shift. The disadvantage of this graphical representation method is that it does not provide a criterion for the preferred or allowed color variation. Again, this is expected to be determined by the intended application.

In the present invention, the reference source for determining CRI and the reference source for determining GAI are selected to be the same (see above and see also section 5.2 of CIE13.3-1995 [13]).

Initial user test reveal that slightly increased red saturation is preferred. Instead of or in addition to using gamut area index (which is based on the unsaturated colors used for CRI calculation), the red saturation index can be used. Disadvantage of red oversaturation is that it will cost efficiency. Further testing showed that especially (also) increased yellow and/or green saturation (Hue between 90 and 160°) is appreciated. Increasing the gamut area by oversaturating these hue bins can be done with limited efficiency penalty.

The optimal (retail) lighting solution may not only be described by the white and color perception, but also by the system efficiency. There is a trade-off between efficiency (1 m/W), white perception (whiteness), and color perception (gamut area index). The highest efficiency solution in LED is an emission spectrum on BBL (Standard CoB), meeting the CRI≥80 and no specific GAI requirement. The Crisp White solution may have a relatively low efficiency: due to the additional deep blue light the overall lumen output per Watt is lower than without the deep blue light. As indicated above, user tests reveal that slight oversaturation of red and/or green/yellow is preferred. Oversaturation, however, of red comes with an efficiency penalty. To meet the energy efficiency demands of Retail lighting, generally at least 1051 m/W on LED level in application is needed. As a consequence, the above suggested solutions may not provide all desired properties, especially for retail lighting. The gamut area index GAI is herein also indicated as GAI.

Hence, it is an aspect of the invention to provide an alternative lighting device, which preferably further at least partly obviates one or more of above-described drawbacks, which especially has a relative high efficiency, a relative high CRI, a high $G_a$ (GAI), a good color rendering and some saturation of one or more colors.

Good white 'rendering' appears to be obtainable by adding violet LEDs to white light blends, but that is costly and may have a significant efficiency penalty. High color saturation index can be obtained by adding deep red phosphor, i.e. increasing the red saturation, but this also may have a significant efficiency penalty.

It was surprisingly found that by shifting the blue peak in the white spectrum to shorter wavelength one or more of a good white 'rendering', a high gamut area index (sometimes also indicated as color saturation index), a perception as CDM-elite, and a good efficiency is obtainable. This can be realized in various manners: tuning the blue LED wavelength and/or tuning the absorption of the (green) phosphor.

Hence, in a first aspect the invention provides a lighting device ("device" or "light emitting device") configured to provide lighting device light, the lighting device comprising (a) a solid state light source configured to provide blue light having a peak wavelength selected from the range of 430-455 nm ("blue light source light"), (b) a first luminescent material configured to convert part of the blue light into first luminescent material light and (c) a second luminescent material configured to convert part of one or more of the blue light and the first luminescent material light into second luminescent material light; wherein the solid state light source, the first luminescent material, and the second luminescent material are selected to provide at a first setting of the lighting device white lighting device light, the white lighting device light having a CRI of at least 90, a gamut area index (GAI) of at least 100, and a $R_9$ value of at least 70. The white lighting device light has a $R_{50}$ value of at maximum 455 nm. In embodiments, the white lighting device light has a $R_{50}$ value of at maximum 450 nm, especially at maximum 445 nm, more especially at maximum 440 nm. The $R_{50}$ value is defined as a first wavelength ($\lambda_{50}$) in a spectral distribution of the white lighting device light at the first setting, wherein the first wavelength ($\lambda_{50}$) is a wavelength closest to the peak wavelength ($\lambda_{PWL}$) (of the blue light in the spectral distribution) but at a longer wavelength than the peak wavelength ($\lambda_{PWL}$) of the blue light where the peak intensity ($I_{50}$) is 50% of the intensity ($I_{PWL}$) at the peak wavelength ($\lambda_{PWL}$). Optionally, the white lighting device light has a correlated color temperature selected from the range of 2200-4500 K.

Such light emitting device may be used in retail for illuminating merchandise, such as e.g. clothes, electronics, (fresh) food, personal care products, etc. etcetera. It surprisingly appears that such light source may have a relative high efficiency, a relative high CRI, a relative high GAI, and some saturation of one or more colors. In (consumer) tests, such lighting device was appreciated over prior art solutions and/or the above suggested solutions. The device may also be used for hospitality lighting, such as in a restaurant, a hotel, a clinic, or a hospital, etc., or for other lighting applications (see also below).

Herein, the terms "violet light" or "violet emission" especially relates to light having a wavelength in the range of about 380-430 nm. The terms "blue light" or "blue emission" especially relate to light having a wavelength in the range of about 430-495 nm (including some violet and cyan hues). The terms "green light" or "green emission" especially relate to light having a wavelength in the range of about 495-570 nm. The terms "yellow light" or "yellow emission" especially relate to light having a wavelength in the range of about 570-590 nm. The terms "orange light" or "orange emission" especially relate to light having a wavelength in the range of about 590-620 nm. The terms "red light" or "red emission" especially relate to light having a wavelength in the range of about 620-780 nm. The term "pink light" or "pink emission" refers to light having a blue and a red component. The terms "visible", "visible light" or "visible emission" refer to light having a wavelength in the range of about 380-780 nm.

As indicated above, the lighting device comprises a solid state light source configured to provide blue light having a peak wavelength ($\lambda_{PWL}$) selected from the range of 430-455 nm, especially having a peak wavelength ($\lambda_{PWL}$) selected from the range of 435-450 nm, more especially selected from the range of 435-445 nm, yet more especially selected from the range 435-440 nm.

The peak wavelength indicates the maximum of the spectral distribution of the solid state light source, such as e.g. specified by producers of solid state light sources. The peak wavelength may especially be defined in relation to a spectral distribution on an energy scale (y-axis in energy instead of photon counts). Smaller or larger peak wavelengths may lead to spectral light distributions that have a less desired GAI and/or lighting devices that are less efficient. Instead of the term "peak wavelength" also the term "peak maximum" may be applied.

Especially, the first luminescent material light (211) has an intensity in one or more of the green and yellow having a CIE $u_1'$, and the second luminescent material light (221) has an intensity in one or more of the orange and red having a CIE $u_2'$, wherein the first luminescent material (210) and the second luminescent material (220) are selected to provide said first luminescent material light (211) and said second luminescent material light (221) defined by a maximum ratio of CIE $u_1'$ (211) and CIE $u_2'$ (221) being CIE $u_2'$ (221)=1.58*CIE $u_1'$ (211)+0.255, and a minimum ratio of CIE $u_1'$ (211) and CIE $u_2'$ (221) being CIE $u_2'$ (221)=2.3*CIE $u_1'$ (211)+0.04. It appears that when one or more luminescent materials are chosen that comply with these conditions, i.e. have a ratio defined by these equations or have a value between these maximum and minimum ratio's, provide especially the desired optical properties of e.g. CIE and GAI, and may provide lighting devices having a good efficiency.

Especially, the first luminescent material (210) has an intensity in one or more of the green and yellow and the CIE v' value is in the range of 0.55-0.58, and the second luminescent material has an intensity in one or more of the orange and red and the CIE v' value is in the range of 0.52-0.55.

Especially, the solid state light source is configured to provide a spectral distribution with at least 80% of the power in the spectral region of 380-495 nm in the range of 415-470 nm, such as in the range of 420-465 nm. The first light source is especially configured to provide blue light having a full width half maximum in the range of up to 100 nm, such as in the range of 5-50 nm. A typical full-width half maximum value of a LED would be in the range of about 15-25 nm, especially in the range of about 15-20 nm. For LED light sources, the dominant wavelength and peak maximum are often substantially identical (for blue LEDs the difference dominant wavelength (DWL) and peak wavelength (PWL) is in the order of 5 nm).

The light source especially comprises a solid state light source, such as a LED or laser diode. The term "light source" may also relate to a plurality of light sources, such as 2-512, like 2-20 solid state light sources. Hence, the term solid state light source may also refer to a plurality of LEDs. Herein, the term "light source" is also applied, and especially refers to "solid state light source". When a plurality of light sources are applied, the light sources may provide light having peak wavelengths (or dominant wavelengths) that are all in the same bin, such as a bin of 5 nm or a bin of 6 nm or a bin of 10 nm. However, optionally two or more bins may be applied. The light source may also comprise a COB (light source).

When different light sources applied, either selected within the same bin or two or more subsets of light sources in e.g. two or more different bins, the light sources or the subsets may be controlled separately. Hence, the lighting device may further comprise a control system configured to control the light source or configured to control a plurality of light sources (see also below).

The peak wavelength ($\lambda_{PWL}$) of the blue solid state light source light may slightly differ from the peak wavelength of the blue light in the spectral distribution of the white light. For instance, this may be due to differences in absorption by the luminescent material(s) over the spectral width of the light source light. Hence, the term peak wavelength may refer to the peak wavelength of the bare solid state light source (die) but in the context of the white lighting device light refers to the peak wavelength of the blue light in the spectral distribution of the white lighting device light (see e.g. FIG. 3).

The light source and the luminescent materials are especially radiationally coupled. The term "radiationally coupled" especially means that the light source and the luminescent material are associated with each other so that at least part of the radiation emitted by the light source is received by the luminescent material (and at least partly converted into luminescence).

When a plurality of light sources is applied, substantially each light source may be radiationally coupled to both luminescent materials. However, in embodiments also a first (subset of) light source(s) may be radiationally coupled with the first luminescent material and a second (subset of) light source(s) may be radiationally coupled with the second luminescent material. Note that even embodiments may be included wherein the light source is only radiationally coupled with the first luminescent material and the second luminescent material is substantially only radiationally coupled with the first luminescent material. This may be the case when the second luminescent material is substantially only excitable by the first luminescent material light, and not by the light source light. In general however, the second luminescent material will also convert part of the light source light.

The term "luminescent material" herein especially relates to inorganic luminescent materials, which are also sometimes indicated as phosphors. These terms are known to the person skilled in the art.

In embodiments, the invention provides a lighting device with the first luminescent material configured to provide first luminescent material light having intensity in one or more of the green and yellow having a CIE u', and a second luminescent material configured to convert part of one or more of the blue light and the first luminescent material light into second luminescent material light having intensity in one or more of the orange and red having a CIE u', wherein the first luminescent material and the second luminescent material are selected to provide said first luminescent material light and said second luminescent material light defined by a maximum ratio of CIE u'(211) and CIE u'(221) being CIE u'(221)=1.58*CIE u'(211)+0.255, and a minimum ratio of CIE u'(211) and CIE u'(221) being CIE u'(221)=2.3*CIE u'(211)+0.04.

The term "CIE u'(211)" is herein also indicated as "CIE u'(first luminescent material light)", and may also be indicated as CIE $u_1'$. The term "CIE u'(221)" is herein also indicated as "CIE u'(second luminescent material light)", and may also be indicated as CIE $u_2'$.

The luminescent materials herein, or especially their luminescent material light, are (is) amongst others identified by CIE u' and v' parameters. The CIE u'v' coordinates refer to the CIE 1976 color space, also known by its abbreviation CIELUV. For example 3000K light (on BBL), characterized by a u',v' color point of 0.251, 0.521 or 0.437, 0.403 in x, y CIE.

In embodiments, for the first luminescent materials, i.e. the yellow and/or green luminescent material, as well as for the second luminescent material, i.e. the red (and orange) luminescent material, the v' value are in the range of about 0.52-0.58, especially in the range of about 0.55-0.58 for yellow/green and about 0.52-0.55 for orange/red. However, other values may also be possible.

As indicated above, in embodiments the first luminescent material and the second luminescent material may be selected to provide said first luminescent material light and said second luminescent material light especially defined by a maximum ratio of CIE u' and CIE u' being CIE u'(second luminescent material light)=1.58*CIE u'(first luminescent material light)+0.255, and a minimum ratio of CIE u' and CIE u' being CIE u'(second luminescent material light)= 2.3*CIE u'(first luminescent material light)+0.04. However, other values may also be possible.

The lighting device is configured to generate lighting device light during operation of the device. The lighting device light may comprise one or more of the solid state light source light, the first luminescent material light and the second luminescent material light. Hence, in embodiments the lighting device light may be white and in other embodiments the lighting device light may be colored. In the first state, the lighting device is configured to provide white lighting device light, which comprises the solid state light source light, and one or more of the first luminescent material light and the second luminescent material light, especially both the first luminescent material light and the second luminescent material light.

As indicated above, the white lighting device light especially has one or more of (i) a correlated color temperature selected from the range of 2200-4500 K, (ii) a CRI of at least 90, (iii) a $R_9$ value of at least 70, and (iv) a $R_{50}$ value of at maximum 455 nm.

The terms "correlated color temperature" or "CCT" are known in the art. The values of 2200-4500 K, especially 2700-4000 K especially appear appreciated by consumers and/or appear to provide desirable results in terms of item recognition, etcetera.

The term "color rendering" is also known in the art. A color rendering of at least 90 is relatively high and may especially provide desirable results in terms of item recognition.

The terms "$R_9$ value" or "$R_9$" are also known in the art. CRI is an average value based on R1-R8. R9 is one of six saturated test colors not used in calculating CRI. The term "$R_9$ value" used herein is a color rendering index value based on $R_9$, and can thus (theoretically) be 100, such as may be the case with tungsten halogen lamps. Therefore, in embodiments the light emitting device may be configured to provide white lighting device light having a $R_9$ value of at least 70, such as at least 80.

The $R_{50}$ value refers to a wavelength relatively closest to the peak maximum of the solid state light source light peak (but at a longer wavelength) where the intensity has dropped to 50 of maximum intensity associated with the peak maximum of the solid state light source light peak. Hence, the $R_{50}$ value is defined as a first wavelength ($\lambda_{50}$) in a spectral distribution of the white lighting device light at the first setting, wherein the first wavelength ($\lambda_{50}$) is a wavelength closest to the peak wavelength ($\lambda_{PWL}$) but at a longer wavelength than the peak wavelength ($\lambda_{PWL}$) of the blue light (in the spectral distribution of the white light) where the peak intensity ($I_{50}$) is 50% of the intensity ($I_{PWL}$) at the peak wavelength ($\lambda_{PWL}$). It appears that a $R_{50}$ value at relative short small wavelength is desirable to provide good efficiency and/or color saturation, etcetera. As indicated above, the white lighting device light has a $R_{50}$ value of at maximum 455 nm, especially of at maximum 450 nm, more especially of at maximum 445 nm, even more especially of at maximum 440 nm. With such values, good white and red rendering can be obtained, with a relative high efficiency and a high color gamut (see also below). For instance, in embodiments the light emitting device may be configured to provide white lighting device light having a gamut area index (GAI) of at least 90, such as at least 100, at the first setting.

In yet further embodiments, the light emitting device may especially be configured to provide white lighting device light with $-0.016 \leq D_{uv} \leq -0.005$, especially $-0.014 \leq D_{uv} \leq -0.005$, at the first setting (standard CIE 2° observer).

In yet further specific embodiments, the light emitting device is configured to provide white lighting device light at the first setting having a CIE v' of at least 0.005 below the black body locus (BBL), and having a CIE v' of at maximum 0.025 below the black body locus (BBL).

It appears that when one or more luminescent materials are chosen that comply with these conditions, i.e. have a ratio defined by these equations or have a value between these maximum and minimum ratio's, provide especially the desired optical properties of e.g. CIE and GAI, and may provide lighting devices having a good efficiency. Herein, the term "selecting" may include determining from a library of luminescent materials data which luminescent material and which combination of luminescent materials may comply with the desired characteristics such as having the u' coordinates at least in the area defined by the above two equations. This type of selecting luminescent materials is known to a person skilled in the art. The luminescent materials data may include absorption wavelengths, excitation wavelengths, emission wavelengths, color points, CRI, etc. etcetera. Hence, the "luminescent materials data" especially include optical data in relation to excitation and emission of the luminescent material(s). As indicated below, the term "luminescent material" may also refer to a plurality of luminescent materials. Hence, when a plurality of first luminescent materials is applied the relevant u' value is based on the spectral distribution of the luminescent material of the plurality of first luminescent materials. Likewise, when a plurality of second luminescent materials is applied the relevant u' value is based on the spectral distribution of the luminescent material of the plurality of second luminescent materials (see herein also the examples wherein two second luminescent materials are applied, one a bit more orange, and the other a bit more red).

In yet further embodiments the first luminescent material and the second luminescent material are selected to provide said first luminescent material light and said second luminescent material light defined by (a) a CIE u' (first luminescent material light) in the range of 0.102-0.12 and a CIE u' (second luminescent material light) in the range of 0.38-0.43, even more especially a CIE u' (first luminescent material light) in the range of 0.102-0.118 and a CIE u' (second luminescent material light) in the range of 0.38-0.415, or by (b) a CIE u'(first luminescent material light) in the range of 0.136-0.164 and a CIE u' (second luminescent material light) in the range of 0.4-0.47, even more especially CIE u'(first luminescent material light) in the range of 0.14-0.158 and a CIE u' (second luminescent material light) in the range of 0.4-0.44. However, the invention is not limited to these embodiments.

In embodiments, the lighting device comprises a first luminescent material configured to convert part of the blue light into first luminescent material light having intensity in one or more of the green and yellow. The first luminescent material may provide also light intensity in other spectral regions upon excitation by the light source. Especially however, the spectral distribution of the first luminescent material light is especially in the green and/or yellow, even more especially in the green. As indicated above, the term "first luminescent material" may also refer to a plurality of different luminescent materials, having different spectral distributions contributing to the first luminescent material light. Especially, the first luminescent material is configured to provide a spectral distribution with at least 80% of the power in the spectral region of 470-650 nm and more specific in the range of 485-630 nm.

Especially, the first luminescent material may comprise $M_3A_5O_{12}:Ce^{3+}$, wherein M is selected from the group consisting of Sc, Y, Tb, Gd, and Lu, wherein A is selected from the group consisting of Al, Ga, Sc and In. Especially, A comprises aluminum (Al), however, A may also partly comprise gallium (Ga) and/or scandium (Sc) and/or indium (In), especially up to about 20% of Al, more especially up to about 10% of Al (i.e. the A ions essentially consist of 90 or more mole % of Al and 10 or less mole % of one or more of Ga, Sc and In); A may especially comprise up to about 10% gallium. In another variant, A and O may at least partly be replaced by Si and N. The element M may especially be selected from the group consisting of yttrium (Y), gadolinium (Gd), terbium (Tb) and lutetium (Lu). The term ":Ce" or ":$Ce^{3+}$", indicates that part of the metal ions (i.e. in the garnets: part of the "M" ions) in the luminescent material is replaced by Ce. For instance, assuming $(Y_{1-x}Lu_x)_3Al_5O_{12}$:Ce, part of Y and/or Lu is replaced by Ce. This notation is known to the person skilled in the art. Ce will replace M in general for not more than 10%; in general, the Ce concentration will especially be in the range of 0.1-4%, especially 0.1-2% (relative to M). Assuming 1% Ce and 10% Y, the full correct formula could be $(Y_{0.1}Lu_{0.89}Ce_{0.01})_3Al_5O_{12}$. Ce in garnets is substantially or only in the trivalent state, as known to the person skilled in the art. The term "YAG" especially refers to M=Y and A=Al; the term "LuAG" especially refers to M=Lu and A=Al. In specific embodiments, the first luminescent material comprises $M_3A_5O_{12}$:$Ce^{3+}$, wherein M is selected from the group consisting of Sc, Y, Tb, Gd, and Lu, wherein A is selected from the group consisting of Al, Ga, Sc and In, and wherein at least one or more of (i) M comprises Lu and (ii) A comprises Ga applies. By choosing Lu and/or Ga, the dominant wavelength of the luminescent material light is shifted to shorter wavelengths relative to YAG.

Hence, a specific example of a suitable first luminescent material is a luminescent material having a peak position (i.e. a peak position in the luminescent material light spectral distribution) selected from the range of 510-570 nm, especially 515-560 nm, and having a FWHM selected from the range of 100-150 nm, such as especially 110-140 nm, like about 120 nm. Especially this applies for relatively broad banded green luminescent materials, such as the cerium doped garnets.

In specific embodiments, A comprises Ga and Al. Especially then the desired spectral distribution may be obtained.

Alternatively or additionally, in embodiments the first luminescent material comprises a divalent europium comprising luminescent material, such as a divalent europium comprising silicate or a divalent europium comprising nitride, or a divalent europium comprising oxynitride, or a divalent europium comprising halide, or a divalent europium comprising oxyhalide, or a divalent europium comprising sulfide, or a divalent europium comprising oxysulfide, or a divalent europium comprising thiogallate.

In specific embodiments, the first luminescent material has a peak maximum selected from the range of 510-530 nm and a full width half maximum selected from the range of 60-80 nm. This may especially apply to the more narrow banded green luminescent materials (see also below).

In embodiments, the first luminescent material comprises one or more of $Ca_8Mg(SiO_4)_4Cl_2$:$Eu^{2+}$ and $Ca_8Zn(SiO_4)_4Cl_2$:$Eu^{2+}$ (such as described by S. Okamoto and H. Yamamoto, Electrochemical and solid-state letters, 12, (12) J112-J115 (2009)). In further embodiments, the first luminescent material comprises a β-SiAlON:$Eu^{2+}$ based green emitting phosphor, especially having the formula $Eu_x(A1)_{6-z}(A2)_zO_yN_{8-z}(A3)_{2(x+z-y)}$, where $0<z\leq4.2$; $0\leq y\leq z$; $0<x\leq0.1$; A1 is Si, C, Ge, and/or Sn; A2 comprises one or more of Al, B, Ga, and In; A3 comprises one or more of F, Cl, Br, and I. The new set of compounds described by $Eu_x(A1)_{6-z}(A2)_zO_yN_{8-z}(A3)_{2(x-z-y)}$ have the same structure as (β-$Si_3N_4$. Both elements A1 and A2 reside on Si sites, and both O and N occupy the nitrogen sites of the β-$Si_3N_4$ crystal structure. A molar quantity (z−y) of the A3⁻ anion (defined as a halogen) reside on nitrogen sites. See further e.g.: Synthesis and Photoluminescence Properties of β-sialon:$Eu^{2+}$ ($Si_{6-z}$ $Al_zO_zN_{8-z}:Eu^{2+}$), A Promising Green Oxynitride Phosphor for White Light-Emitting Diodes, R.-J. Xiez, N. Hirosaki, H.-L. Li, Y. Q. Li and M. Mitomo, J. Electrochem. Soc. 2007 volume 154, issue 10, J314-J319.

A specific example of a suitable first luminescent material is a luminescent material having a peak position (i.e. a peak position in the luminescent material light spectral distribution) selected from the range of 510-530 nm, especially 515-525 nm, and having a FWHM selected from the range of 50-90 nm, such as especially 60-80 nm, like about 70 nm. Especially this applies for relatively narrow banded green luminescent materials.

Further, as indicated above the lighting device especially comprises a second luminescent material configured to convert part of one or more of the blue light and the first luminescent material light into second luminescent material light having intensity in one or more of the orange and red. The second luminescent material may provide also light intensity in other spectral regions upon excitation by the light source. Especially however, the spectral distribution of the second luminescent material light is especially in the orange and/or red, even more especially in the red. As indicated above, the term "second luminescent material" may also refer to a plurality of different luminescent materials, having different spectral distributions contributing to the second luminescent material light. Especially, the second luminescent material is configured to provide a spectral distribution with at least 80% of the power in the spectral region of 570-760 nm in the range of 585-720 nm.

In embodiments, the second luminescent material may comprise one or more materials selected from the group consisting of $(Ba,Sr,Ca)S:Eu$, $(Ba,Sr,Ca)AlSiN_3:Eu$ and $(Ba,Sr,Ca)_2Si_5N_8:Eu$. In these compounds, europium (Eu) is substantially or only divalent, and replaces one or more of the indicated divalent cations. In general, Eu will not be present in amounts larger than 10% of the cation; its presence will especially be in the range of about 0.5 to 10%, more especially in the range of about 0.5 to 5% relative to the cation(s) it replaces. The term ":Eu", indicates that part of the metal ions is replaced by Eu (in these examples by $Eu^{2+}$). For instance, assuming 2% Eu in $CaAlSiN_3:Eu$, the correct formula could be $(Ca_{0.98}Eu_{0.02})AlSiN_3$. Divalent europium will in general replace divalent cations, such as the above divalent alkaline earth cations, especially Ca, Sr or Ba.

The material $(Ba,Sr,Ca)S:Eu$ can also be indicated as MS:Eu, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca).

Further, the material $(Ba,Sr,Ca)_2Si_5N_8:Eu$ can also be indicated as $M_2Si_5N_8:Eu$, wherein M is one or more elements selected from the group consisting of barium (Ba), strontium (Sr) and calcium (Ca); especially, M comprises in this compound Sr and/or Ba. In a further specific embodiment, M consists of Sr and/or Ba (not taking into account the presence of Eu), especially 50 to 100%, more especially 50 to 90% Ba and 50 to 0%, especially 50 to 10% Sr, such as $Ba_{1.5}Sr_{0.5}Si_5N_8:Eu$ (i.e. 75% Ba; 25% Sr). Here, Eu is introduced and replaces at least part of M, i.e. one or more of Ba, Sr, and Ca).

Likewise, the material $(Ba,Sr,Ca)AlSiN_3:Eu$ can also be indicated as $MAlSiN_3:Eu$, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca).

In specific embodiments, the second luminescent material comprises $MAlSiN_3:Eu$, wherein M is one or more elements selected from the group consisting of barium (Ba), strontium (Sr) and calcium (Ca), especially one or more of Sr and Ca. In an embodiment, the second luminescent material comprises $CaAlSiN_3:Eu$ ("eCAS") and in another embodiment, the second luminescent material comprises $SrAlSiN_3:Eu$ (eSCAS). The latter is blue shifted by up to about 30 nm relative to the former. Especially, these type of luminescent materials may provide the desired optical properties together with the first luminescent materials and the light source. In further specific embodiments, the second luminescent material comprises different $MAlSiN_3:Eu$ compounds, with a first compound with M at least comprising Ca and a second compound with M at least comprising Sr. Hence, in such first compound M may predominantly, such as at least 50%, even more especially at least 90%, comprise Ca, and in such second compound M may predominantly, such as at least 50%, even more especially at least 90%, comprise Sr. Part of M is replaced by Eu, such as about 0.1-4%.

A specific example of a suitable second luminescent material is a luminescent material having a peak position (i.e. a peak position in the luminescent material light spectral distribution) selected from the range of 610-680 nm, especially 616-650 nm, and having a FWHM selected from the range of 60-150 nm, such as especially 60-130 nm, like about 80-120 nm.

In specific embodiments, the second luminescent material comprises a first second luminescent material having a first second peak maximum selected from the range of 610-640 and a full width half maximum selected from the range of 60-110 nm and a second luminescent material having a second luminescent material peak maximum selected from the range of 630-680 nm and having a full width half maximum selected from the range of 60-130 nm, and wherein the first second peak maximum and the second peak maximum differ with at least 10 nm, such as in the range of 15-40 nm. The first second luminescent material may be slightly more orange than the second luminescent material, and the second luminescent material may (thus) be slightly redder than the first second luminescent material.

Especially good results may be obtained when the second luminescent material comprises $MAlSiN_3:Eu$, wherein M comprises one or more elements selected from the group consisting of barium (Ba), strontium (Sr) and calcium (Ca), wherein the second luminescent material comprises (at least two) different $MAlSiN_3:Eu$ compounds, with a first compound with M at least comprising Ca and a second compound with M at least comprising Sr.

Hence, the lighting device comprise the first luminescent material and/or the second luminescent material, especially at least both the first luminescent material and the second luminescent material, which are radiatively coupled to the light source. The first luminescent material is especially configured to provide first luminescent material light with a dominant wavelength in the green, yellow, or optionally orange. The second luminescent material is especially configured to provide second luminescent material light with a dominant wavelength in the red. Hence, the first luminescent material and the second luminescent material are different luminescent materials. Of course, the lighting device may comprise further luminescent materials.

Therefore, in specific embodiments of the light emitting device:

the solid state light source is configured to provide blue light having a peak wavelength ($\lambda_{PWL}$) selected from the range of 430-455 nm, especially 435-445 nm;

the solid state light source has a LED die, wherein the lighting device comprises a light converter comprising said first luminescent material and said second luminescent material, and wherein the light converter is in physical contact with the LED die;

the first luminescent material comprises $M_3A_5O_{12}:Ce^{3+}$, wherein M is selected from the group consisting of Sc, Y, Tb, Gd, and Lu, wherein A is selected from the group consisting of Al, Ga, Sc and In, and wherein A comprises Ga and Al;

the second luminescent material comprises $MAlSiN_3:Eu$, wherein M comprises one or more elements selected from the group consisting of barium (Ba), strontium (Sr) and calcium (Ca), wherein the second luminescent material comprises different $MAlSiN_3:Eu$ compounds, with a first compound with M at least comprising Ca and a second compound with M at least comprising Sr; and the light emitting device is configured to provide white lighting device light at the first setting having an $R_{50}$ value of at maximum 455 nm, especially at maximum 450 nm.

The luminescent material(s) may be provided as such, such as a coating of the luminescent material predominantly or even entirely consisting of the luminescent material(s), or may be embedded in a matrix, such as a silicone matrix or a PMMA matrix. Combinations of these embodiments may also be possible. The different luminescent materials may be provided in different ways, and may e.g. be provided in different matrix layers or in different matrices.

In specific embodiments, the solid state light source has a LED die, wherein the lighting device comprises a light converter comprising said first luminescent material and said second luminescent material, and wherein the light converter is in physical contact with the LED die. Note that optionally the light converter may only comprise one of the luminescent materials. Further, the term "light converter" may also refer to a plurality of (different) light converters. Yet further, when a plurality of light sources are applied, one or more light sources may radiationally coupled to one or more light converters including substantially only the first luminescent material and one or more light sources may radiationally coupled to one or more light converters including substantially only the second luminescent material. The light converter may comprise a garnet material, or a polymer material, like a resin, or PMMA or siloxane polymer, etcetera. The light converter is transmissive for the light source light and the luminescent material light. In yet further embodiments, which may be combined with one or more of the preceding embodiments, the light converter is not in physical contact with the light source, but is configured at some distance from the LED die, such as 0.5-100 mm from the LED die.

The lighting device is especially configured to provide white light (at a first setting). Hence, especially the lighting device is configured to provide at said first setting of the lighting device white lighting device light. The phrase "at a first setting of the lighting device" indicates that the lighting device at least includes a single setting such as "on". Hence, the invention also provides lighting devices which have (substantially) no tunability in intensity except for "on" and "off". A plurality of settings may especially be available when there is more than one light source. When a plurality of setting is possible, at least one setting may provide white light. Other settings may provide white light with a different color temperature or colored light, etcetera.

The term "white light" herein, is known to the person skilled in the art. It especially relates to light having a correlated color temperature (CCT) between about 2000 and 20000 K, especially 2700-20000 K, for general lighting especially in the range of about 2700 K and 6500 K, and for backlighting purposes especially in the range of about 7000 K and 20000 K, and especially within about 15 SDCM (standard deviation of color matching) from the BBL (black body locus), especially within about 10 SDCM from the BBL, even in some embodiments within about 5 SDCM from the BBL.

Hence, a plurality of settings may especially be provided when the lighting device further comprises a control system, configured to control the lighting device light (by controlling the light source(s). Therefore, in yet a further embodiment the light emitting device may further comprise a control system configured to control the power provided to the (one or more) (solid state) light sources. Alternatively or additionally, the control system may be (configured) external from the light emitting device. Optionally, the control system may comprise a plurality of elements, of which some may be comprised by the light emitting device and others may be external from the light emitting device (such as a remote user interface, see also below). The light emitting device may e.g. be integrated in a lighting system with a plurality of light emitting devices and optional other type of light emitting devices than described herein.

In yet a further specific embodiment, the control system is configured to control the power provided to the one or more (solid state) light sources as function of an input signal of a user interface. This user interface may be integrated in the light emitting device, but may also be remote from the light emitting device. Hence, the user interface may in embodiments be integrated in the light emitting device but may in other embodiments be separate from the light emitting device. The user interface may e.g. be a graphical user interface. Further, the user interface may be provided by an App for a Smartphone or other type of android device. Therefore, the invention also provides a computer program product, optionally implemented on a record carrier (storage medium), which when run on a computer executes the method as described herein (see below) and/or can control (the color temperature of the light emitting device light of) the light emitting device as described herein (as function of the power provided to the one or more (solid state) light sources).

Alternatively or additionally, the control system is configured to control the power provided to the one or more (solid state) light sources as function of one or more of a sensor signal and a timer. To this end, e.g. a timer and/or a sensor may be used. For instance, the timer may be used to switch off after a predetermined time. Further, for instance the sensor may be a motion sensor, configured to sense motion, with the control system configured to switch on the light emitting device when the motion sensor senses motion or presence of e.g. a person. Further, the sensor may be an optical sensor, e.g. to sense the light, especially the light emitting device light, reflected by a product (illuminated with the light emitting device light).

Hence, in a further aspect the invention also provides a lighting system comprising the light emitting device as defined herein and a control system configured to control the light emitting device. As indicated above, the control system may also be comprised by the lighting device. The lighting system may especially comprise a control system configured to control the lighting device and one or more other devices, such as a plurality of the lighting devices as described herein and optionally also other lighting devices. The control system may control the lighting device(s) as function of one or more of a sensor signal and a timer (see also above).

As indicated above, the person skilled in the art knows how to select luminescent materials from a library with luminescent materials data to provide the desired optical properties.

In yet further embodiments, the lighting device is configured to provide at said first setting of the lighting device white lighting device light having a color rendering index (CRI) of at least 80, especially at least 90. Hence, especially the light source and the luminescent materials are selected that are capable in providing (at the first setting) such CRI of the lighting device light.

In further embodiments, the lighting device is configured to provide at said first setting of the lighting device white lighting device light having a gamut area index (GAI) of at least 80, even more especially at least 90, yet even more especially at least 100, such as in the range of 101-120. Hence, especially the light source and the luminescent materials are selected that are capable in providing (at the first setting) such GAI.

In a specific embodiment of the light emitting device, the solid state light source, the first luminescent material and the second luminescent material are configured to provide a spectral distribution with at least 80% of the power in the spectral region of 380-495 nm in the range of 440-480 nm, at least 80% of the power in the spectral region of 470-650 nm in the range of 485-630 nm, and at least 80% of the power in the spectral region of 570-760 nm in the range of 585-720 nm. Yet even more especially, the solid state light source, the first luminescent material and the second luminescent material are configured to provide a spectral distribution with a first maximum selected from the range of 440-450 nm with a full width half maximum selected from the range of 15-30 nm (i.e. especially provided by the light source), and a band comprising at least two maxima with a second maximum selected from the range of 515-545 nm (due to the first luminescent material) and a third maximum selected from the range of 610-630 nm (due to the second luminescent material), wherein the band has an intensity of at least 40% (Watt) of the first maximum over the entire wavelength range of 500-680 nm. The luminescence band is provided by the luminescence of the first luminescent material and the second luminescent material. In other words, the height in the luminescence spectrum of such light emitting device has a first maximum at 435-450 nm, and over the entire wavelength range of 500-680 nm, the spectral intensity is at least as high as 50% of the peak maximum at 440-450 nm.

Yet more especially, the solid state light source is configured to provide blue light having a peak wavelength selected from the range of 430-455 nm, wherein the first luminescent material comprise $M_3(Al,Ga)_5O_{12}$:Ce, and wherein the second luminescent material comprises (at least two luminescent materials, respectively comprising) $CaAlSiN_3$:Eu and $SrAlSiN_3$:Eu, wherein M is as defined above, and wherein especially A comprises both Al and Ga.

Some suitable materials are indicated below (in the first table), which may be, when combined in the right ratios and radiatively coupled with a blue light source, provide in operation white lighting device light with the herein described desired properties:

| | CIE x | CIE y | CIE' | CIE v' | Emission max | Excitation max |
|---|---|---|---|---|---|---|
| Green (first luminescent material) | 0.3597 | 0.5558 | 0.1608 | 0.5589 | 525 nm | 441 nm |
| orange (red) (second luminescent material) | 0.6031 | 0.3959 | 0.3686 | 0.5444 | 610 nm | <400 nm |
| Red (second luminescent material) | 0.6452 | 0.3535 | 0.4336 | 0.5346 | 642 nm | <400 nm |
| alternative green (alternative first luminescent material) | 0.3664 | 0.5580 | 0.1635 | 0.5603 | 530 nm | 445 nm |

Some embodiments of lighting device light with suitable properties are provided below:

| $R_{50}$ (nm) | CIE u' | CIE v' | CIE x | CIE y |
|---|---|---|---|---|
| 450 | 0.249 | 0.512 | 0.423 | 0.386 |
| 457 | 0.249 | 0.508 | 0.418 | 0.379 |

Other embodiments may also be possible.

For instance, relative to the data in this second table one or more of u' and v' may differ at maximum 5% of these values. For example, u' being 0.249*1.05 or 0.249*0.95. Or, for example, v' being 0.512*1.05 or 0.512*0.95. Especially, relative to the data in this table one or more of u' and v' may differ at maximum such as at maximum 2%, even more especially at maximum 1%.

For instance, relative to the data in this table one or more of x and y may differ at maximum 5% of these values. For example, x being 0.423*1.05 or 0.423*0.95. Or, for example, y being 0.379*1.05 or 0.379*0.95. Especially, relative to the data in this table one or more of u' and v' may differ at maximum such as at maximum 2%, even more especially at maximum 1%.

The lighting device may be part of or may be applied in e.g. office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, green house lighting systems, horticulture lighting, or LCD backlighting.

The lighting device may be used in hospitality lighting, retail lighting, etcetera. Further, the lighting device may be configured as retrofit lamp. Further, the lighting device may include optics. For instance, in embodiments the lighting device is configured as parabolic aluminized reflector (PAR) lamp.

BRIEF DESCRIPTION OF THE DRAWINGS

Embodiments of the invention will now be described, by way of example only, with reference to the accompanying schematic drawings in which corresponding reference symbols indicate corresponding parts, and in which.

The schematic drawings are not necessarily on scale.

DETAILED DESCRIPTION OF THE EMBODIMENTS

Figure 1A:
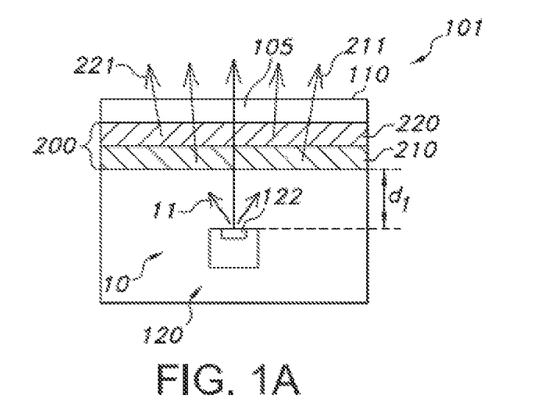
FIGS. 1a-1c schematically depict some aspects of the invention.

FIG. 1a schematically depicts an embodiment of a lighting device 100 as described herein. The lighting device 100 comprises a light source 10 configured to provide blue light source light 11, a first luminescent material 210 configured to convert at least part of the light source light 11 into first luminescent material light 211 with light intensity in one or more of the green spectral region and yellow spectral region and a second luminescent material 220 configured to convert (i) at least part of the light source light 11, or (ii) at least part of the light source light 11 and at least part of the first luminescent material light 211 into second luminescent material light 221 with light intensity in the orange and/or red spectral region.

Further, the lighting device comprises a light exit face 110. Herein in the embodiment of FIG. 1a, this may be the downstream face of a window 105.

The terms "upstream" and "downstream" relate to an arrangement of items or features relative to the propagation of the light from a light generating means (here the especially the first light source), wherein relative to a first position within a beam of light from the light generating means, a second position in the beam of light closer to the light generating means is "upstream", and a third position within the beam of light further away from the light generating means is "downstream".

Figure 1B:
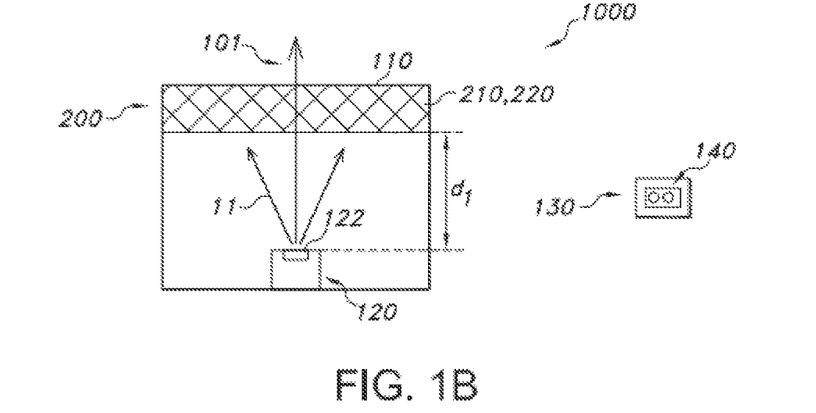
Figure 1C:
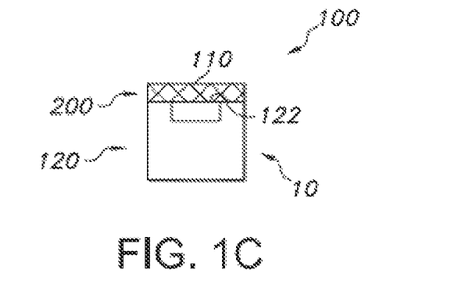

In FIG. 1b this is the downstream face of a converter 200. Here, in FIGS. 1a-1c the converter 200 comprises the first luminescent material 210 and the second luminescent material 220, e.g. a layers (FIG. 1a), or as mixture (FIGS. 1b-1c). Note that the converter 200 may also include materials and/or layers other than the first luminescent material 210 and the second luminescent material 220. In FIG. 1a, the converter is configured upstream of the light exit face, here upstream of window 105. Especially, when using separate layers of the first luminescent material 210 and the second luminescent material 220, the latter is configured downstream of the former, in order to further facilitate absorption of the first luminescent material light 211. Would the second luminescent material 220 substantially not absorb first luminescent material light 211, then the order of the layers may also be revered. Further, also mixtures may be applied (see FIGS. 1b-1c).

Further, the lighting device 100 is configured to provide lighting device light 101 downstream from said light exit face 110. Here, as shown in FIG. 1a, the lighting device light 101 comprises one or more of said light source light 11, said first luminescent material light 211, and said second luminescent material light 221. As indicated above, the second luminescent material 220 is configured to be at least partly saturated with (i) light source light 11, or (ii) light source light 11 and first luminescent material light 211.

The distance between the first and/or the second luminescent materials and the light source 10, especially the light emitting surface, is indicated with reference d1, which is (substantially) zero in the case of FIG. 1c (d1 not depicted in FIG. 1c) and which may be in the range of 0.1-50 mm, especially 1-20 mm in e.g. the embodiment of FIGS. 1a-1b. In the schematically depicted embodiment, the distance d1 is the distance between a light exit surface (or light emitting surface) 122 of a solid state light source 120, such as an LED die.

FIG. 1b schematically further depicts a control system 130, which may include a user interface 140. Hence, FIG. 1b also schematically depicts a lighting system 1000.

The lighting device 100 may especially be applied for providing white lighting device light 101.

Hence, amongst others the invention provides a light source for providing blue light, a first luminescent material for providing first luminescent material light and a second luminescent material for providing second luminescent material light, which are configured to provide white lighting device light (at a first setting) having spectral distributions (Watt) in the range of 11-14%, especially 11.9-12.7% for the blue light, 31-35%, especially 32.7-33.5% for the first luminescent material light, and 52-57%, especially 53.9-55.3%, for the second luminescent material light. Even more especially, the invention provides the light source for providing blue light, the first luminescent material for providing first luminescent material light and the second luminescent material for providing second luminescent material light, wherein the second luminescent material comprises a first second luminescent material for providing first second luminescent material light, and a second luminescent material for providing second luminescent material light, which are configured to provide white lighting device light (at a first setting) having spectral distributions (Watt) in the range of 11-14%, especially 11.9-12.7% for the blue light, 31-35%, especially 32.7-33.5% for the first luminescent material light, and 28-50%, especially 29.8-47.9% for first second luminescent material light and 5-27%, especially 6-25.5%, for the second luminescent material light. Especially, this applies to first luminescent materials having a relatively narrow band width, such as in the range of 60-90 nm.

Hence, amongst others the invention provides a light source for providing blue light, a first luminescent material for providing first luminescent material light and a second luminescent material for providing second luminescent material, which are configured to provide white lighting device light (at a first setting) having spectral distributions (Watt) in the range of 11-13%, especially 11.4-12.2% for the blue light, 40-47%, especially 41-45.9% for the first luminescent material light, and 41-49%, especially 42.1-47.6% for the second luminescent material light. Even more especially, the invention provides the light source for providing blue light, the first luminescent material for providing first luminescent material light and the second luminescent material for providing second luminescent material, wherein the second luminescent material comprises a first second luminescent material for providing first second luminescent material light, and a second luminescent material for providing second luminescent material light, which are configured to provide white lighting device light (at a first setting) having spectral distributions (Watt) in the range of 11-13%, especially 11.4-12.2% for the blue light, 40-47%, especially 41-45.9% for the first luminescent material light, and 0-16%, especially 0-14.6% for first second luminescent material light and 30-48%, especially 32-46%, for the second luminescent material light.

Percentages of the spectral distribution (in the visible) add up to 100%.

The effect of blue pump position in the final white spectrum influences the white 'rendering' and the gamut area. It appears that shifting the blue LED peak towards shorter wavelength leads to a better (=whiter) white 'rendering' and increases the gamut area. The extension of the gamut area is in the yellow and blue orientation, and thus does not lead to a severe efficiency penalty. Oversaturation in the yellow-blue orientation also occurs for high pressure discharge lamps like CDM-elite and CDM-ultimo, which are generally seen as giving the best general retail lighting spectrum.

Amongst others, a LED based light device is proposed wherein one or more of the following applies:
1. $R_{50}$ (nm)≤455 nm, more especially $R_{50}$ (nm)≤450 nm
2. CRI≥90
3. $R_9$≥70
4. CCT=2700-4000 K
5. −0.005≥Duv≥−0.014 (i.e. about 6-14 points below BBL)
6. $R_g$≥100

Figure 2:
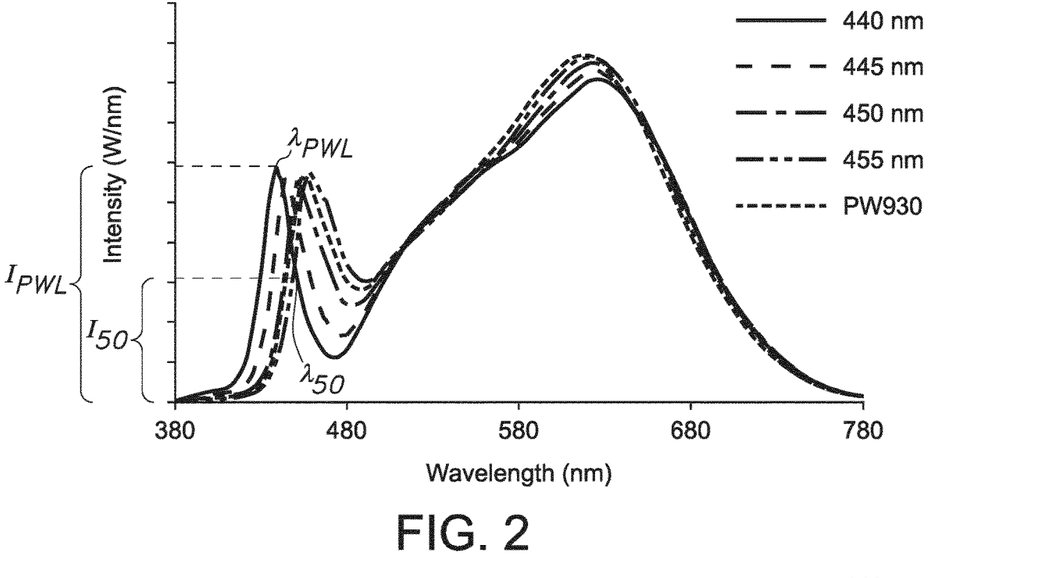
FIG. 2 shows spectra of premium white products made using a GaYAG green (or green/yellow) phosphor (GaYAG) in combination with first red or orange phosphor and second orange or red phosphor. Mixture of red phosphors adjusted to get CRI≥90 and $R_9$=70); the wavelengths indicate the peak wavelength of the LED used; PW930 indicates a reference premium white product.

Especially, at least the first condition applies. Even more especially, also one or more of the other conditions apply. In this way, white 'rendering', a high color saturation index, a perception as CDM-elite and good efficiency can be obtained. Good white 'rendering' can be obtained by adding violet LEDs, but that is costly and has a significant efficiency penalty. High color saturation index can be obtained by adding deep red phosphor, i.e. increasing the red saturation, but this also has a significant efficiency penalty. To mimic the perception of CDM-elite, oversaturation in the yellow-blue orientation may be needed. We have surprisingly found that the object of the invention can be realized by shifting the blue peak in the white spectrum to shorter wavelength. This can be realized in various manners: tuning the blue LED wavelength and/or tuning the absorption of the (green) phosphor. LEDs were made using GaYAG and a mixture of a first red or orange phosphor and second orange or red phosphor; the ratio of the two red phosphors was adjusted to get an $R_9$ of 70 and a CRI ≥90, see also FIG. 2. Blue LEDs with different pump wavelength (PWL) between 440 and 455 nm were used. The target color point was 0.249, 0.512 in CIE u' v' for all samples. The ratio of the different red/orange luminescent materials was varied to keep CRI and $R_9$ essentially equal.

The blue peak position in the final spectrum will depend on the phosphors used. The blue peak position in the final white spectrum is characterized by the $R_{50}$ (nm). The $R_{50}$ (nm) is defined as the point at the long wavelength side of the blue emission peak were the intensity has dropped to 50% of the maximum intensity of the blue peak. The $R_{50}$ (nm) for the different spectra is shown in FIG. 3 and in the below table.

TABLE 1

Figure 3:
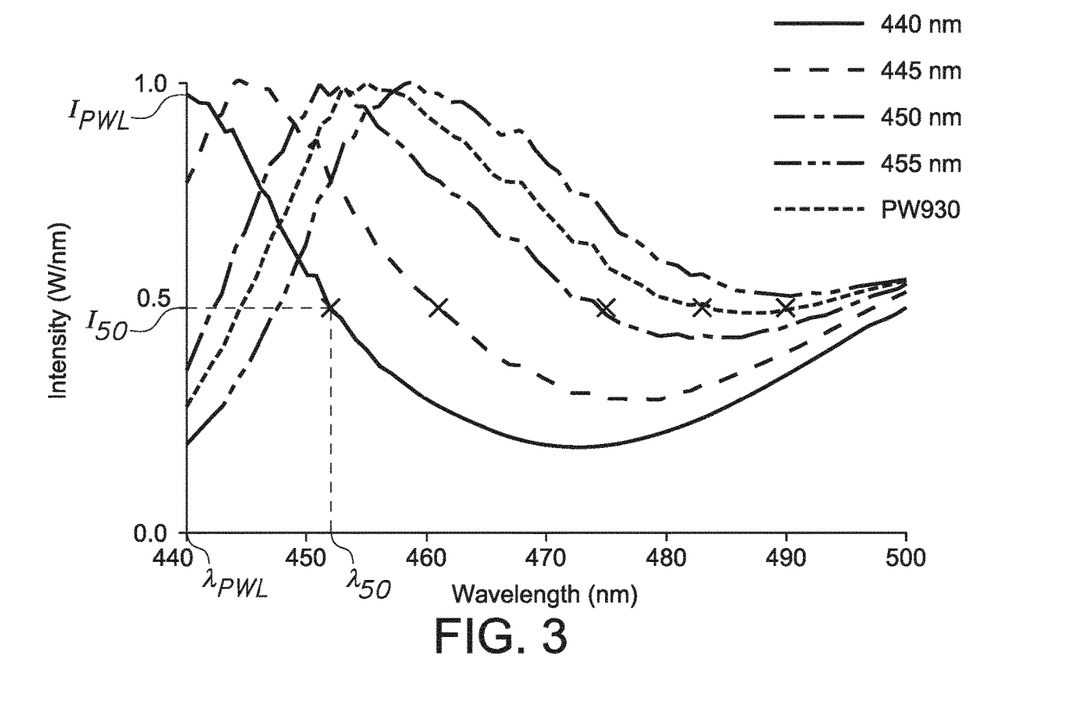
FIG. 3 shows the $R_{50}$ (nm) (indicates in the graph as $\lambda_{50}$) for the different spectra shown in FIG. 2.

PWL and $R_{50}$ (nm) for the spectra shown in FIG. 3

| PWL (nm) | $R_{50}$ (nm) |
|---|---|
| 440 | 452 |
| 445 | 461 |
| 450 | 475 |
| 455 | 490 |

Figure 4:
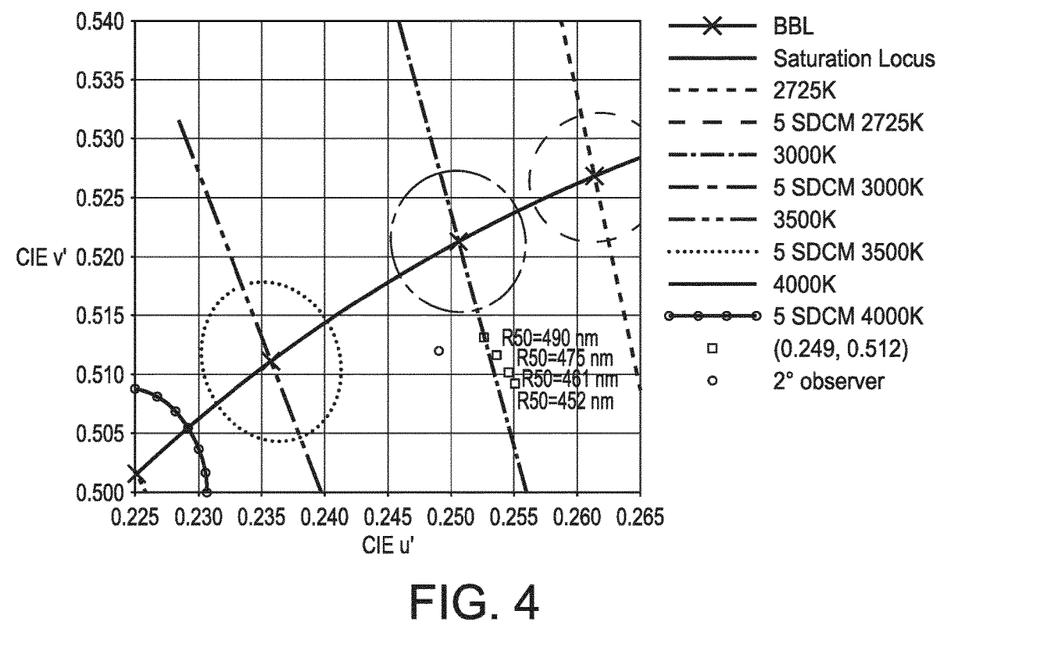
FIG. 4 shows CIE u' v' color points calculated using a standard 2° observer (open circle) and using the CIE 2006-10° observer (open squares). The label gives the $R_{50}$ (nm) of the 4 samples.

The better white 'rendering' is also supported by FIG. 4. Besides a significant red shift (CIE u') the color points also move further below BBL for spectra that use a shorter wavelength blue pump LED (or shorter $R_{50}$). As a consequence, the color points for the samples with a short $R_{50}$ are shifting significantly further below BBL (the distance to the BBL increases from ~8 pts to ~13 pts). This is perceived as much better (more preferred) white.

Figure 5:
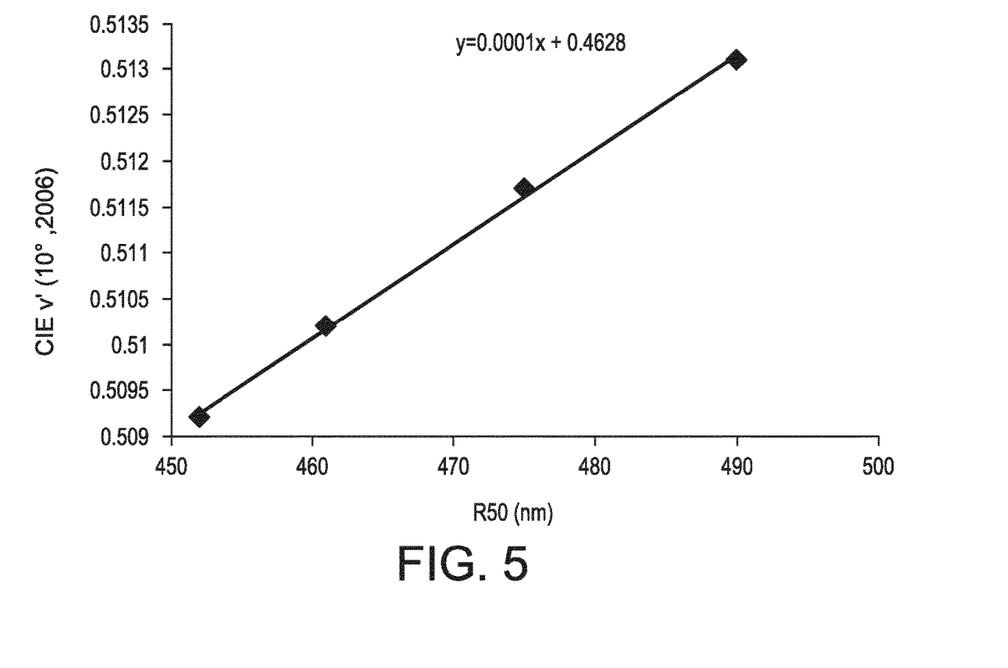
FIG. 5 shows CIE v' color point (CIE 2006-10° observer) as a function of the $R_{50}$ (nm). Starting color point was (0.249, 0.512) in all cases (calculated using the standard CIE 2° observer)

The CIE v' (calculated using the CIE 2006-10° observer) as a function of the $R_{50}$ (nm) is shown in FIG. 5.

Figure 6:
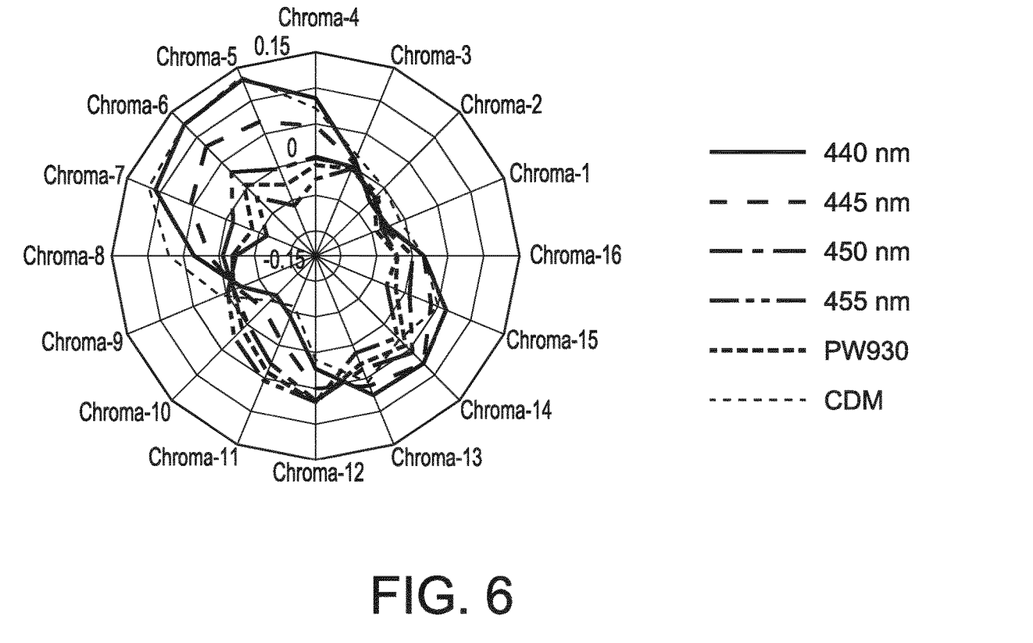
FIG. 6 shows the change in chroma for hue bin 1-16 as defined in IES TM30-15 (Scale −0.15 to +0.15) for white LED spectra with varying PWL, compared with PW930 and CDM.

IES TM30-15 was used to calculate the change in chroma induced by these sources. The change in chroma is plotted in a radar plot for the 16 different hue bins (FIG. 6) defined by IES TM30-15. Decreasing the $R_{50}$ (nm) leads to an increase of the chroma (increasing saturation) for hue bins 4-7. The shape of the curve resembles the chroma changes observed for CDM-elite (often still referred to as the reference source). We found by preference testing that this gives a color perception close to CDM-elite.

The proposed combination of spectral features leads to a preferred color rendering, combined with good white rendering with a small efficiency penalty and high color saturation index $R_g$. GAI as defined in IES TM30-15 is herein also indicated as "$R_g$".

In an example, GaYAG in combination with second orange or red phosphor and first red or orange phosphor (see above) was used. The latter two are a mixture of 2 red phosphors (SrAlSiN$_3$:Eu ("orange") and CaAlSiN$_3$:Eu ("red")).

Figure 7:
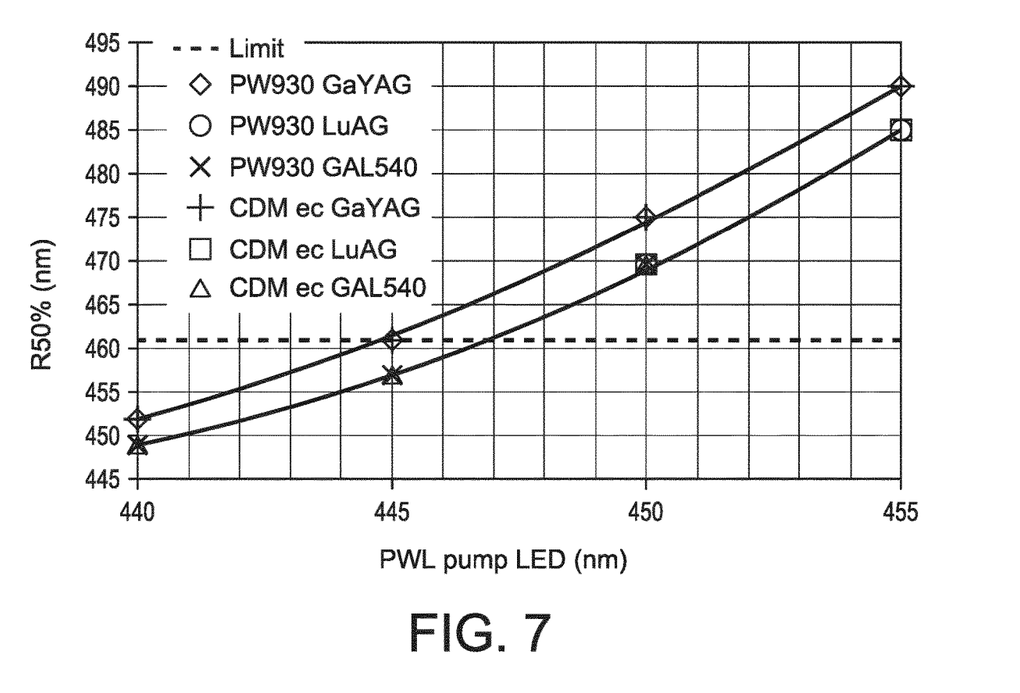
FIG. 7 shows $R_{50}$ (nm) as a function of the PWL of the blue LED for different green phosphors (GaYAG versus LuAG).

In another example, Intematix GAL540 in combination with second orange or red phosphor and first red or orange phosphor can be used. Very similar graphs as shown above can be obtained. There is however a small (but significant) shift in the $R_{50}$ (nm) due to the change of the green phosphor as shown in FIG. 7. Visual judgement of the samples showed that the $R_{50}$ (nm) should be below 462 nm, but more preferably even below 450 nm.

A reference lamp indicates ad PW930 had the following values for white light generated therewith: $R_{50}$=472, cie v'=0.511. Two alternative spectral distributions were created:

$R_{50}$=457 nm, preferred cie v'=0.508; and
$R_{50}$=450 nm, preferred cie v'=0.512.

Some combinations were composed, as indicated in the table below:

| PWL (nm) | Green/Yellow (first luminescent material) | Orange luminescent material (second luminescent material) | Red luminescent material (also second luminescent material) | CRI | R9 | $R_{50}$ (nm) |
|---|---|---|---|---|---|---|
| 440 | GaYAG | not available | available | 91 | 74 | 452 |
| 445 | GaYAG | available | available | 93 | 73 | 462 |
| 450 | GaYAG | available | available | 94 | 72 | 474 |
| 455 | GaYAG | available | available | 93 | 74 | — |

The term "substantially" herein, such as in "substantially all light" or in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of". The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention further applies to a device comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Further, the person skilled in the art will understand that embodiments can be combined, and that also more than two embodiments can be combined. Furthermore, some of the features can form the basis for one or more divisional applications. Below, some references in relation to the gamut area index (GAI or $G_a$) are provided, which references are herein incorporated by reference.

REFERENCES FOR $G_a$

[1] American National Standards Institution, American National Standard for electric lamps—Specification for the Chromaticity of Fluorescent Lamps, ANSI C78.376-2001
[2] American National Standards Institution, American National Standard for electric lamps—Specifications for the Chromaticity of Solid State Lighting Products, ANSI C78.377: 2011.
[3] CEI/IEC 60081:1997+A1:2000. Double-capped fluorescent lamps—Performance specifications.
[4] IEC 62612:2013. Self-ballasted LED lamps for general lighting services with supply voltages>50V— Performance requirements.
[5] IEC 62717:2014. LED modules for general lighting—Performance requirements
[6] IEC 62722-2-1:2014. Luminaire performance—Part 2-1: Particular requirements for LED luminaires.
[7] ISO 8995:2002(E)/CIE S 008/E-2001, Lighting of indoor work places
[8] Commission regulation (EC) No 244/2009, Implementing Directive 2005/32/EC of the European Parliament and of the Council with regard to eco-design requirements for non-directional household lamps.
[9] Commission regulation (EC) No 245/2009. Implementing Directive 2005/32/EC of the European Parliament and of the Council with regard to eco-design requirements for fluorescent lamps without integrated ballast, for high intensity discharge lamps, and for ballasts and luminaries able to operate such lamps, and repealing Directive 2000/55/EC of the European Parliament and of the Council.
[10] Commission regulation (EU) No 347/2010. Amending Commission Regulation (EC) No 245/2009 as regards the eco-design requirements for fluorescent lamps without integrated ballast, for high intensity discharge lamps, and for ballasts and luminaries able to operate such lamps.
[11] Commission regulation (EU) No 1194/2012. Implementing Directive 2009/125/EC of the European Parliament and of the Council with regard to eco-design requirements for directional lamps, light emitting diode lamps and related equipment.
[12] ENERGY STAR®. Program Requirements Product Specification for Lamps (Light Bulbs)—Eligibility Criteria, Version 1.1, 2014.
[13] Commission Internationale de l'Eclairage, Method of Measuring and Specifying Colour Rendering Properties of Light Sources. CIE Publication 13.3, Vienna: CIE 13.3, 1995.
[14] Teunissen, C., van der Heijden, F. H. F. W., Poort, S. H. M., & de Beer, E. (2016). Characterising user preference for white LED light sources with CIE color rendering index combined with a relative gamut area index. Lighting Research & Technology, 1477153515624484.

[15] Ohno Y, Fein M, Miller C. Vision experiment on chroma saturation for color quality preference. In: Proceedings of the 28th CIE session 2015; CIE 216:2015, Volume 1, Part 1; pp. 60-69. Manchester, United Kingdom, Jun. 28-Jul. 4: 2015.

The invention claimed is:

1. A lighting device configured to provide lighting device light, the lighting device comprising a solid state light source configured to provide blue light having a peak wavelength selected from the range of 430-455 nm, a first luminescent material configured to convert part of the blue light into first luminescent material light and a second luminescent material configured to convert part of one or more of the blue light and the first luminescent material light into second luminescent material light, wherein the solid state light source, the first luminescent material, and the second luminescent material are selected to provide at a first setting of the lighting device white lighting device light having a CRI of at least 90, a gamut area index (GAI) of at least 100, a $R_9$ value of at least 70 and a $R_{50}$ value of at maximum 455 nm, wherein the $R_{50}$ value is defined as a first wavelength ($\lambda_{50}$) in a spectral distribution of the white lighting device light at the first setting, wherein the first wavelength ($\lambda_{50}$) is a wavelength closest to the peak wavelength ($\lambda_{PWL}$) but at a longer wavelength than the peak wavelength ($\lambda_{PWL}$) of the blue light where the peak intensity ($I_{50}$) is 50% of the intensity ($I_{PWL}$) at the peak wavelength ($\lambda_{PWL}$),
and wherein the first luminescent material light has an intensity in one or more of the green wavelength range and yellow wavelength range having a CIE $u_1'$, and the second luminescent material light has an intensity in one or more of the orange wavelength range and red wavelength range having a CIE $u_2'$, wherein the first luminescent material and the second luminescent material are selected to provide said first luminescent material light and said second luminescent material light defined by a maximum ratio of CIE $u_1'$ and CIE $u_2'$ being CIE $u_2'$=1.58*CIE $u_1'$+0.255, and a minimum ratio of CIE $u_1'$ and CIE $u_2'$ being CIE $u_2'$(221)= 2.3*CIE $u_1'$+0.04.

2. The light emitting device according to claim 1, wherein the blue light has a peak wavelength ($\lambda_{PWL}$) selected from the range of 435-445 nm.

3. The light emitting device according to claim 1, configured to provide white lighting device light having a gamut area index (GAI) in the range of 101-120 at the first setting.

4. The light emitting device according to claim 1, configured to provide white lighting device light at the first setting having an $R_{50}$ value of at maximum 450 nm.

5. The light emitting device according to claim 1, configured to provide white lighting device light at the first setting having a CIE v' of at least 0.005 below the black body locus (BBL), and having a CIE v' of at maximum 0.025 below the black body locus (BBL).

6. The light emitting device according to claim 1, configured to provide white lighting device light with $-0.014 \leq D_{uv} \leq -0.005$ at the first setting.

7. The light emitting device according to claim 1, wherein the first luminescent material has an intensity in one or more of the green wavelength range and yellow wavelength range and the CIE v' value is in the range of 0.55-0.58, and the second luminescent material has an intensity in one or more of the orange wavelength range and red wavelength range and the CIE v' value is in the range of 0.52-0.55.

8. The light emitting device according to claim 1, configured to provide white lighting device light at the first setting having a correlated color temperature selected from the range of 2700-4000 K.

9. The light emitting device according to claim 1, wherein the first luminescent material comprises $M_3A_5O_{12}$:$Ce^{3+}$, wherein M is selected from the group consisting of Sc, Y, Tb, Gd, and Lu, wherein A is selected from the group consisting of Al, Ga, Sc and In.

10. The light emitting device according to claim 1, wherein the second luminescent material comprises $MAlSiN_3$:Eu, wherein M comprises one or more elements selected from the group consisting of barium (Ba), strontium (Sr) and calcium (Ca), wherein the second luminescent material comprises different $MAlSiN_3$:Eu compounds, with a first compound with M at least comprising Ca and a second compound with M at least comprising Sr.

11. The light emitting device according to claim 1, wherein:
the solid state light source is configured to provide blue light having a peak wavelength ($\lambda_{PWL}$) selected from the range of 435-445 nm
the solid state light source has a LED die, wherein the lighting device comprises a light converter comprising said first luminescent material and said second luminescent material, and wherein the light converter is in physical contact with the LED die;
the first luminescent material comprises $M_3A_5O_{12}$:$Ce^{3+}$, wherein M is selected from the group consisting of Sc, Y, Tb, Gd, and Lu, wherein A is selected from the group consisting of Al, Ga, Sc and In;
the second luminescent material comprises $MAlSiN_3$:Eu, wherein M comprises one or more elements selected from the group consisting of barium (Ba), strontium (Sr) and calcium (Ca), wherein the second luminescent material comprises different $MAlSiN_3$:Eu compounds, with a first compound with M at least comprising Ca and a second compound with M at least comprising Sr; and
the light emitting device is configured to provide white lighting device light at the first setting having an $R_{50}$ value of at maximum 455 nm.

12. The light emitting device according to claim 1, configured to provide white lighting device light having spectral distributions (Watt) in the range of 11-13% for the blue light, 40-47% for the first luminescent material light, and 30-48% for the second luminescent material light, at the first setting.

13. A lighting system comprising the light emitting device according to claim 1 and a control system configured to control the light emitting device.

14. Use of the light emitting device according to claim 1 in retail lighting.

* * * * *